US012581875B2

(12) United States Patent
Leeser et al.

(10) Patent No.: US 12,581,875 B2
(45) Date of Patent: Mar. 17, 2026

(54) PROCESSING TOOL CAPABLE FOR FORMING CARBON LAYERS ON SUBSTRATES

(71) Applicant: Lam Research Corporation, Fremont, CA (US)

(72) Inventors: Karl Frederick Leeser, West Linn, OR (US); Lee Chen, Cedar Creek, TX (US); Yukinori Sakiyama, West Linn, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 808 days.

(21) Appl. No.: 17/619,212

(22) PCT Filed: Jun. 25, 2020

(86) PCT No.: PCT/US2020/039578
§ 371 (c)(1),
(2) Date: Dec. 14, 2021

(87) PCT Pub. No.: WO2020/264133
PCT Pub. Date: Dec. 30, 2020

(65) Prior Publication Data
US 2022/0246428 A1 Aug. 4, 2022

Related U.S. Application Data

(60) Provisional application No. 62/867,770, filed on Jun. 27, 2019.

(51) Int. Cl.
*C23C 16/26* (2006.01)
*C23C 16/505* (2006.01)
(Continued)

(52) U.S. Cl.
CPC ........ *H01L 21/02274* (2013.01); *C23C 16/26* (2013.01); *C23C 16/505* (2013.01);
(Continued)

(58) Field of Classification Search
CPC ......... H01L 21/02274; H01L 21/02115; H01L 21/0332; C23C 16/26; C23C 16/515;
(Continued)

(56) References Cited

U.S. PATENT DOCUMENTS 4,844,785 A 7/1989 Kitabataka et al.
6,338,881 B1 * 1/2002 Sellschopp ........... C23C 16/045
427/249.7

(Continued)

FOREIGN PATENT DOCUMENTS

CN 103695869 A 4/2014
JP 2004018968 A * 1/2004
(Continued)

OTHER PUBLICATIONS

JP-2004018968-A, machine translation, originally published 2004, p. 1-11 (Year: 2004).*

(Continued)

*Primary Examiner* — Gordon Baldwin
*Assistant Examiner* — Christina D Mcclure
(74) *Attorney, Agent, or Firm* — Alleman Hall LLP

(57) ABSTRACT

A substrate processing tool capable of forming an carbon layer on a substrate by generating a plasma including carbon and non-carbon ions in a processing chamber, suspending the carbon and non-carbon ions in the processing chamber, removing mostly the suspended non-carbon ions from the processing chamber, and bombarding the substrate surface with mostly carbon ions. The one or more steps of the above sequence may be repeated until the carbon layer is of desired thickness.

19 Claims, 5 Drawing Sheets

(51) Int. Cl.
    *C23C 16/515*      (2006.01)
    *C23C 16/517*      (2006.01)
    *H01J 37/32*      (2006.01)
    *H01L 21/02*      (2006.01)

(52) U.S. Cl.
    CPC .......... *C23C 16/515* (2013.01); *C23C 16/517* (2013.01); *H01J 37/32082* (2013.01); *H01J 37/32422* (2013.01); *H01J 37/32449* (2013.01); *H01L 21/02115* (2013.01); *H01J 2237/332* (2013.01)

(58) Field of Classification Search
    CPC ................ C23C 16/505; C23C 16/517; H01J 37/32082; H01J 37/32422; H01J 37/32449; H01J 2237/332
    See application file for complete search history.

(56) References Cited

U.S. PATENT DOCUMENTS

2005/0127284 A1* 6/2005 Guevremont ....... H01J 49/0031
    250/281

2009/0266984 A1* 10/2009 Hirano .................... H01J 49/06
    250/288
2010/0055911 A1 3/2010 Fujihara
2011/0031104 A1* 2/2011 Barker ................. C01B 32/188
    204/157.2
2012/0048831 A1 3/2012 Rueger
2012/0088371 A1 4/2012 Ranjan et al.
2019/0237319 A1* 8/2019 Green .................. H01J 49/427
2020/0091418 A1* 3/2020 Annunziata ........... H10B 61/00

FOREIGN PATENT DOCUMENTS

JP      2005-082887      3/2005
KR      10-2019-0040870      4/2019

OTHER PUBLICATIONS

International Search Report from International Application No. PCT/US2020/039578 dated Oct. 7, 2020.
Written Opinion from International Application No. PCT/US2020/039578 dated Oct. 7, 2020.

* cited by examiner

PROCESSING TOOL CAPABLE FOR FORMING CARBON LAYERS ON SUBSTRATES

CROSS-REFERENCE TO RELATED APPLICATION

This application claims the benefit of priority of U.S. Application No. 62/867,770, filed Jun. 27, 2019, which is incorporated herein by reference for all purposes.

BACKGROUND

The present invention relates to a substrate processing tool, and more particularly, to a substrate processing tool capable of forming a carbon layer on a substrate by sequentially (1) generating a plasma including carbon and non-carbon ions in a processing chamber, (2) suspending the carbon and non-carbon ions in the processing chamber, (3) removing mostly the non-carbon ions from the processing chamber, and (4) bombarding the substrate surface with mostly carbon ions. In alternative embodiments, the sequence (1) through (4) can be repeated multiple times until the carbon layer is of desired thickness.

Diamond-Like Carbon or "DLCs" are a class of carbon materials that exhibit diamond-like properties, including extreme hardness, wear resistance, and "slickness". The most common DLC is tetrahedral carbon or "ta-C", which is the hardest, most wear resistant, and slickest among the class.

Various plasma-based deposition techniques have been used to deposit ta-C onto substrates such as semiconductor wafers. Such techniques include Mass Selected Ion Beam (MSIB), Filtered Cathodic Vacuum Arc (FCVA), Pulsed Laser Ablation (PLA) and Electron Cyclotron Wave Resonance (ECWR). While each of these plasma-based techniques can be used for forming ta-C on a substrate in a laboratory setting, they are not practical for full scale fabrication of semiconductor wafers. For instance, the deposition rate for MSIB, FCVA, and PLA is very low because each relies on a beam-based plasma source that has to scan the entire wafer. As a result, the deposition rate is too slow for semiconductor wafer fabrication on a large, industrial, scale. ECWR, to some degree, overcomes the low deposition rate of the aforementioned other techniques. However, ECWR tools are extremely expensive and are too costly to be practically used for semiconductor wafer fabrication on a large, industrial scale.

It is also known to use Plasma Enhanced Chemical Vapor Deposition (PECVD) tools including a graphite target to deposit carbon layers onto substrates. With these tools, carbon is emitted off the graphite target and a radio frequency (RF) is applied, resulting in a carbon only plasma. The issue with these tools is that the carbon ions have a relatively low energy as they deposit on the surface of the substrate. As a result, a polycrystalline diamond-like carbon film having a relatively large crystal structure (1 to many micrometers), and strong bonds, is formed. Such carbon layers are often not suitable with certain types of substrates, such as semiconductor wafers, because they impart a significant amount of stress that can cause the wafer to bend, bow or even crack. Thus, for certain applications, such as patterning masks, an amorphous, "dust-like" carbon with random and/or sub nanometer bonding is preferred because such layers impart much less stress on the underlying wafer.

A PECVD tool and method for forming carbon layers on a large, industrial, scale, is therefore needed.

SUMMARY

A present invention relates to a plasma tool and method for generating carbon layers on a substrate. To form the carbon layer, the tool implements a sequence of steps involving generating a plasma including carbon ions and non-carbon ions in a processing chamber, suspending the carbon ions and non-carbon ions in the processing chamber by removing the RF energy applied to the plasma, removing mostly the suspended non-carbon ions from the processing chamber, and then bombarding the substrate surface with mostly the suspended carbon ions in the processing chamber. By controlling the relative voltage potential of the carbon ions with respect to the substrate during bombardment, the carbon ions can have sufficient energy to both deposit on the substrate surface and implant into the bulk of the substrate. As a result, a carbon layer is formed.

The steps of removing mostly non-carbon ions and bombarding the substrate may optionally be repeated until the carbon layer is of desired thickness. This is accomplished by providing a varying DC voltage, in the form of a series of negative and positive voltage pulses, to an electrode that is located distal to the substrate in the processing chamber. During the negative pulses, mostly non-carbon ions are attracted to the electrode and then subsequently removed from the chamber. As a result, a very high ratio of carbon ions remains in the processing chamber. During the subsequent positive pulse, the carbon ions remaining in the processing chamber bombard the substrate. The varying DC voltage is typically applied preferably when the carbon and hydrogen ions are suspended after the removal of the RF energy.

In various embodiments, the plasma is generated using a precursor that contains carbon and non-carbon. Representative precursors include, but are not limited to, acetylene ($C_2H_2$), methane ($CH_4$) or some other precursor that contains carbon and hydrogen. With the precursor in the processing chamber, RF energy is applied to an electrode, resulting in the plasma of non-carbon and carbon ions in the processing chamber.

In various alternative embodiments, the application of the RF for generating the plasma can be interspersed with the series of negative and positive pulses. Alternatively, the plasma can be generated only when the carbon in the processing chamber needs to be replenished. In alternative embodiments, the RF can be applied to the same electrode as the negative and positive DC voltage pulses, or a second electrode in the processing chamber.

In yet another non-exclusive embodiment, the electrode also neutralizes the charge of the ions it comes into contact by surface recombination neutralization. A vacuum pump, located in the vicinity of the electrode, removes the neutralized ions from the processing chamber.

In specific, but non-exclusive embodiments, the carbon layer may be a wide variety of different types of carbon layers, including various types of a Diamond Like Carbon (DLC) layer such as hydrogenated amorphous carbon (a-C:H) and hydrogenated tetrahedral amorphous carbon (ta-C:H) and tetrahedral amorphous carbon or "ta-C" and/or other types of carbon layers having predominately sp3 bonds such as diamond layers, carbon layers having relatively large crystal structures (1 to many micrometers) or relatively small crystal structures (sub nanometer size), carbon layers including predominately sp2 bonds such as graphite, and so called amorphous carbon which is generally characterized as being "dust like" and having little to no SP3 and/or SP2 bonds.

BRIEF DESCRIPTION OF THE DRAWINGS

The present application, and the advantages thereof, may best be understood by reference to the following description taken in conjunction with the accompanying drawings in which.

DETAILED DESCRIPTION

The present application will now be described in detail with reference to a few non-exclusive embodiments thereof as illustrated in the accompanying drawings. In the following description, numerous specific details are set forth in order to provide a thorough understanding of the present disclosure. It will be apparent, however, to one skilled in the art, that the present discloser may be practiced without some or all of these specific details. In other instances, well known process steps and/or structures have not been described in detail in order to not unnecessarily obscure the present disclosure.

Figure 1:
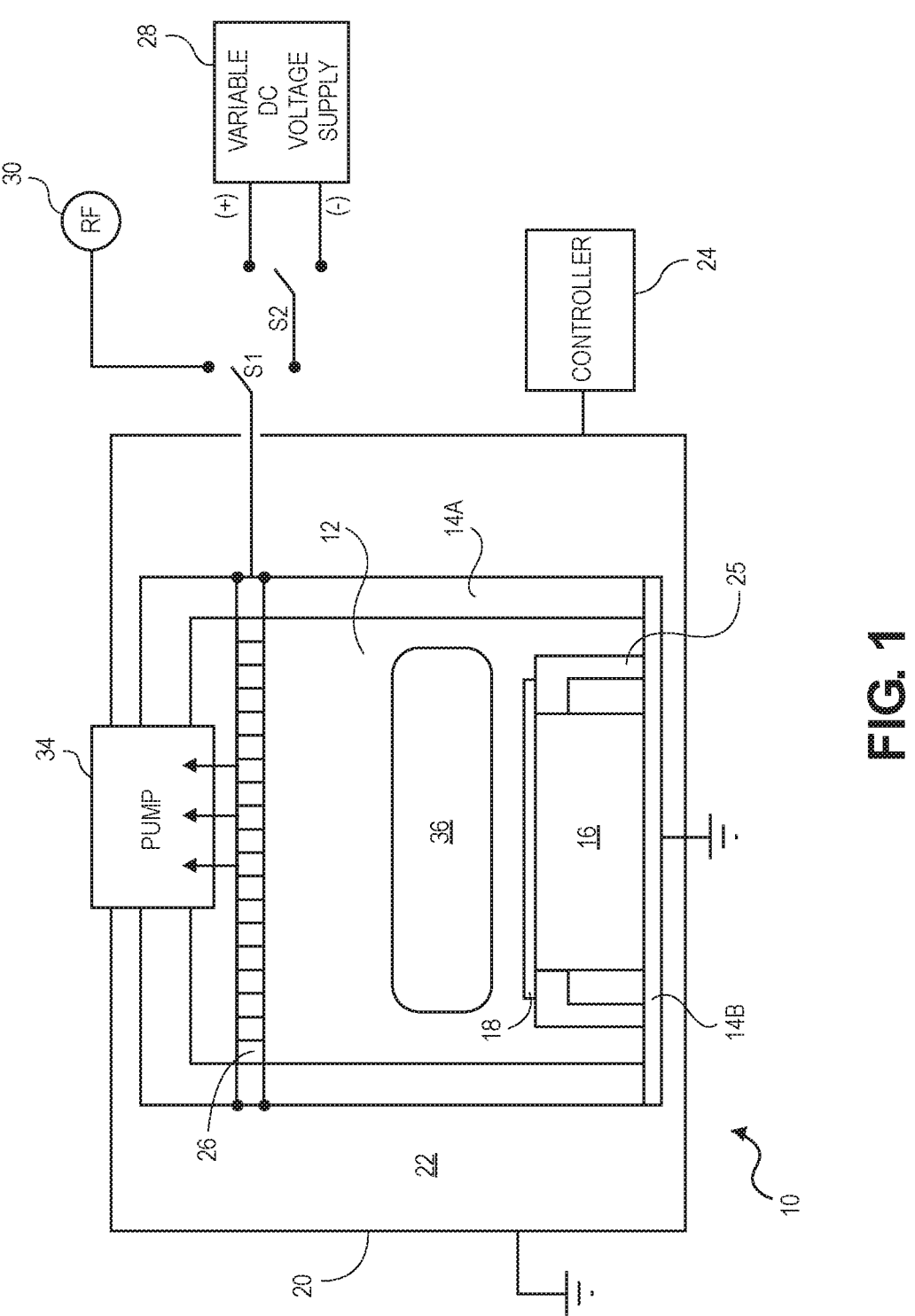
FIG. 1 is diagram of a processing tool capable of forming a carbon layer on a substrate in accordance with a non-exclusive embodiment of the invention.

Referring to FIG. 1, a diagram of a processing tool 10 in accordance with the present invention is illustrated. In various embodiments, the processing tool 10 may include one or multiple processing chambers. For the sake of simplicity, the discussion below pertains to just a single processing chamber.

The processing tool 10 includes a processing chamber 12 defined by insulating walls 14A and a base plate 14B coupled to ground, a substrate pedestal 16 for supporting a substrate 18 within the processing chamber 12, a ground cage 20 formed around, but separated from, the insulating walls 14A and base plate 14B of the processing chamber 12 by an atmospheric gap 22 and a controller 24.

The insulating walls 14A of the processing chamber can be made from any of a number of various different insulating materials, such as aluminum oxide ($Al_2O_3$), quartz, sapphire, or other dielectric material(s).

The pedestal 16 includes an anode ring 25 that is at least partially positioned underneath a portion of the substrate 18 overhanging the pedestal 16. In one particular embodiment, the anode ring 25 is coupled to DC ground via the base plate 14B. The substrate pedestal 16 and anode ring 25 are used to clamp the substrate 18 in place using any number of known chucking methods, including electrostatic (ESC), vacuum, mechanical clamping, or any combination thereof.

In a non-exclusive embodiment, the anode ring 25 maintained at DC-ground and RF-ground as well. One way of accomplishing both DC and RF ground is to securely bolt or otherwise mechanically clamp the anode ring 25 to the base plate 14B. If other grounding techniques are used, for example a thin wire connected between the anode ring 25 and the base plate 14B, other issues may ensue. For instance, such a thin wire may have an inductive impedance at RF/VHF frequencies may be simply too high, resulting in the anode ring 25 "floating" with respect to the RF/VHF.

The ground cage 20, which is preferably made of a highly conductive material such as aluminum, isotropic graphite, or other appropriate materials, is coupled to ground. Air is provided in the gap 22 between the ground cage 20 and the walls 14 defining the processing chamber 12.

The plasma deposition tool 10 further includes a number of other features and/or elements that facilitate the formation of a carbon layer on substrate 18. These features and/or elements include an electrode 26 located in the processing chamber 12 distal from the substrate 18, a variable DC voltage supply 28, a Radio Frequency (RF) source 30, and a pair of switches S1 and S2 and a vacuum pump 34 fluidly coupled to the space immediately above or in the vicinity of the electrode 26. The switches S1 and S2 operate together to selectively connect the electrode 26 to either:

(a) The RF source 30;

(b) A negative (–) terminal of the variable DC voltage supply 28; or (c) A positive (+) terminal of the variable DC voltage supply 28.

It should be understood that switches S1 and S2, as described throughout the present application, may be implemented using either two physical switches or other circuitry that can implement either switching logic or functionality similar to that described herein. In the case of the latter for example, the functionality of the switches S1 and S2 can be implemented by varying the signal level of a voltage amplifier to generate the positive and negative DC pulses.

The electrode 26 performs a number of functions. These functions include:

When connected to the RF source 30 via the switch S1, the electrode proves RF energy into the processing chamber 12. When one or more reactant(s) is/are introduced into the chamber 12 with the RF energy, plasma 36 is generated. In non exclusive embodiments, the reactant is acetylene ($C_2H_2$), methane ($CH_4$) or any other reactant containing carbon and hydrogen. With such reactants, plasma having an overall positive charge is created, including a mix of hydrogen ions and carbon ions, both of which have a positive net charge. Such as plasma is sometime referred to as a "Debye sheath" or "Debye plasma" because of its greater density of positive ions, named after the Dutch scientist, Peter Debye, who discovered this phenomena.

In one non-exclusive embodiment, the RF source 30 is 100 MHz. In other embodiments, the RF source 30 may be 13 MHz, 27 MHz, or any other RF frequency suitable for generating the plasma 36 within the processing chamber 12. Such suitable frequencies may fall within what is generally considered to be the low, medium, or high radio frequency ranges, and may range anywhere from 400 kHz to 5 GHz. In yet other alternative embodiments, the electrode 26 may be coupled to the RF source 30 either capacitively or inductively.

With the anode ring 25 in contact with the substrate 18 and both DC and RF grounded, several benefits are realized with respect to the electrode 26. During application of the RF, the substrate 18 acts as an RF reference ground, not DC ground, since the substrate is "floating" and its impedance to DC ground is near infinite. As a result, the area ratio between the substrate 18 and the electrode 26 is, in a non-exclusive embodiment, at or near 1:1. It should be understood, however, that there is no requirement that the ratio be 1:1. In other embodiments, the surface area ratio of the substrate 18 and the electrode 26 can be greater than or less than 1:1.

The electrode 26 also provides within the processing chamber 12 negative and positive DC pulses. With S1 connected to S2 (as opposed to the RF source 30), S2 can be controlled to generate a series of negative or positive pulses that are applied to the electrode 26. For instance, by switching to the negative terminal for 1 to 2 microseconds, a pulse having negative amplitude and a duration of 1 to 2 microseconds is generated. Alternatively, by switching to the positive terminal for 10 to 15 microseconds, a pulse having a positive amplitude and duration of 10 to 15 microseconds is generated. The amplitude (either positive of negative) of the pulses is determined by the DC voltage supply 30. Since the DC voltage supply is variable, the amplitude for a given pulse may widely vary. Accordingly, by controlling the switches S1 and S2 and the DC voltage supply 30, pulses that vary in pulse width, amplitude, and polarity can be generated and applied to the electrode 26.

The negative and positive pulses DC pulses applied to the electrode 26 provide a useful function in forming a carbon layer on the substrate. With negative pulses, positive ions in the plasma sheath are attracted to the electrode 26. Since hydrogen ions have a lower atomic mass compared to carbon ions, the hydrogen ions accelerate and move toward the electrode significantly faster than the carbon ions. In contrast, the higher mass carbon ions have more inertia, and as a result, move slower in response to the negative voltage applied to the electrode 26. Thus, by purposely limiting the duration or width of the negative pulse, vastly more hydrogen ions can be removed from the processing chamber 12 than carbon ions. By way of example, the Applicant has found that by limiting the width of the negative pulses to 1 to 2 microseconds, a large percentage (e.g., more than 90%) of the hydrogen ions can be removed from the plasma sheath, while a relatively small percentage (e.g., less than 10% or 15%) of the carbon ions are removed. As a result, the overwhelming majority of the ions remaining in the plasma sheath are carbon.

When a subsequent positive DC pulse is applied to the electrode 26, the positive voltage repel and accelerate the mostly carbon ions toward the substrate 18. In addition, with the substrate 18 biased at or near ground via the anode ring 25, the carbon atoms have sufficient energy to bombard the surface of the substrate 18. As a result, the carbon atoms not only deposit on the surface of the substrate 18, but also sub-implant into the bulk of the substrate 18. As a result, a carbon layer is formed.

The electrode 26 may also act, in non-exclusive embodiments, as charge neutralizing "trap" for the ions removed from the plasma sheath. By a process known as surface recombination neutralization, charged ions exchange their charge when they come into contact with a surface of the element 26, becoming charge neutral. In this case, the hydrogen and carbon ions of the plasma sheath have a positive charge. The negative charge applied to the electrode 26 attracts the positively charged ions. When the ions contact a surface of the electrode 26, a charge exchange occurs, neutralizing the ions. The electrode 26 can therefore be referred to as a sub-Debye neutralizer. In certain non-exclusive embodiments, the electrode 26 may include a catalytic material that aids in charge neutralization. Such catalytic materials may include, but are not limited to aluminum, aluminum nitride, aluminum oxide, graphite or any other material that may aid in the neutralization of charges.

In the embodiment shown in FIG. 1, the electrode 26 is positioned near the top of the processing chamber 12 such that the plasma 36 is located between the substrate 18 and the electrode 26. With this arrangement, negative pulses from the variable DC voltage supply 28 attract the hydrogen ions to the electrode 26, in a direction opposite the substrate 18. In an alternative embodiment (not illustrated), the electrode can be positioned below the substrate 18 near the bottom of the processing chamber 12. With this arrangement, positive pulses from the variable DC voltage supply 28 applied to the electrode repel the hydrogen ions in a direction away from the substrate 18 and the electrode 26. This arrangement also aids in sub-plantation control when bombarding the wafer with the carbon ions.

The pump 34 is provided immediately adjacent to or above the electrode 26. The function of the pump 34 is to vacuum remove the trapped ions neutralized by the electrode 26 from the processing chamber 12. In a non-exclusive embodiment, the pump 34 has the ability to pump approximately 500 liters per second from the processing chamber 12. In other embodiments, the pumping ability may widely range as appropriate. By keeping the gap or space between the electrode 26 and the pump 34 relatively small, and the vacuum pressure high, plasma can be prevented from occurring during periods when the RF source 30 is connected to the electrode 26.

The controller 24 is used to control the overall operation and processing sequence of the plasma deposition tool 10. In particular, the controller 24 is provided to manage and control the overall operation of the deposition tool 10 by operating the various components, including but not limited to the switches S1 and S2, the variable DC voltage supply 28, RF source 30, pump 34, the generation of the plasma 36, the supply of a reactant gas or gasses into the processing chamber 12, and virtually all the other operations of the processing tool 10 as described herein.

The controller 24 typically includes one or more non-transient computer readable medium devices for storing system control software or code and one or more processors for executing the code. The term "non-transient computer readable medium" is used generally to refer to media such as main memory, secondary memory, removable storage, and storage devices, such as hard disks, flash memory, disk drive memory, CD-ROM and other forms of persistent memory, but not transitory subject matter, such as carrier waves or signals. The processor may include a CPU or computer, multiple CPUs or computers, analog and/or digital input/output connections, motor controller boards, etc.

In certain embodiments, the controller 24, running or executing the system software or code, controls all or at least most of the activities of the tool 10, including such activities as controlling the timing of the processing operations, frequency and power of operations of the RF source 30, pressure within the processing chamber 12, flow rates, concentrations and temperatures of any gas(es) into the process chamber 12 and their relative mixing, temperature of a substrate 18 supported by the substrate holder 16, etc.

The controller 24 may also include a user interface (not shown). The user interface may include a display screen, graphical software displays of indicative of operating parameters and/or process conditions of the processing tool 10, and user input devices such as pointing devices, keyboards, touch screens, microphones, etc., that allow a human operator to interface with the processing tool 10.

Information transferred between the controller 24 and the various above-listed components of the processing tool 10 may be in the form of signals such as electronic, electromagnetic, optical, or other signals capable of being transmitted and/or received via any communication link that carries signals and may be implemented using wire or cable, fiber optics, a phone line, a cellular phone link, a radio frequency link, and/or other communication channels.

Precursors

The formation of a carbon layer on the substrate 18 requires carbon. In various non-exclusive embodiments, carbon is introduced into the processing chamber 12 in the form of one or more precursor gasses, such as acetylene ($C_2H_2$), methane ($CH_4$) or some other gas that contains at least carbon. While such precursors contain the requisite carbon, they also typically contain hydrogen, which can be somewhat detrimental for forming the various carbon layers as defined herein. As described herein, the Applicant has found a method of using the processing tool 10 to deposit carbon, at just about any desired thickness, by modulating the pulses and/or RF applied to the electrode 26.

Process Flow

Figure 2:
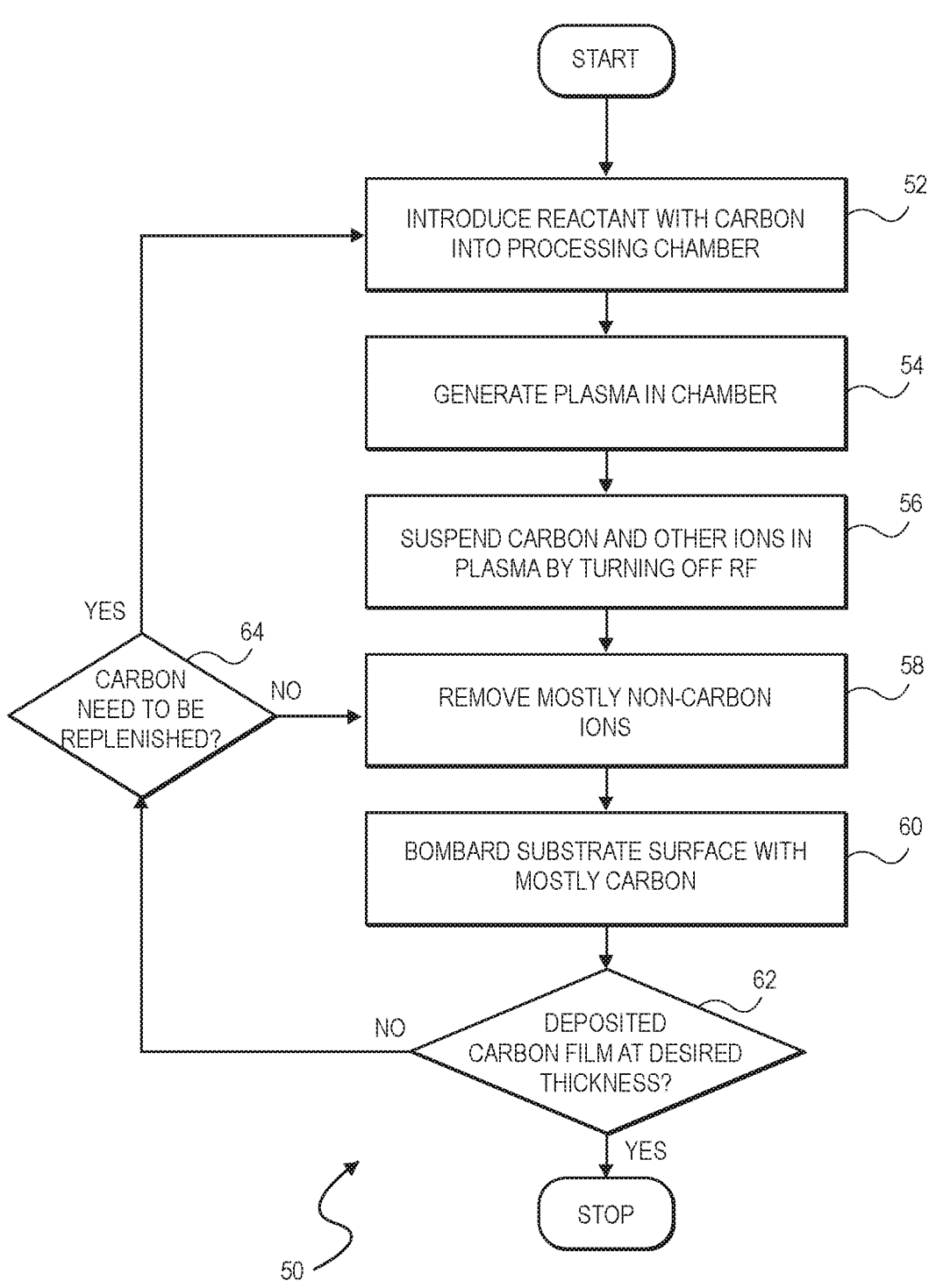
FIG. 2 is an operational flow diagram of the processing tool showing a sequence of steps for forming the carbon layer on the substrate in accordance with non-exclusive embodiments of the invention.

Referring to FIG. 2, an operational flow diagram 50 of the processing tool 10 showing a sequence for forming a carbon layer of just about any desired thickness on the substrate 18 is shown. As noted above, this sequence is largely controlled and implemented by the controller 24.

In step 52, a precursor containing carbon is introduced into the processing chamber 12. The precursor may be acetylene ($C_2H_2$), methane ($CH_4$), or any other precursor that contains carbon. Depending on the precursor used, the hydrogen or some other element may also be present in the processing chamber as well. As described below, the hydrogen or other element is at least partially removed in subsequent steps, leaving mostly carbon remaining in the processing chamber 12.

In step 54, the RF source 30 is activated and connected to the electrode 26 via switch S1. As a result, a plasma sheath 36 is generated in the processing chamber 12 between the substrate 18 and the electrode 26. With the precursors mentioned above, the resulting plasma includes a mix of both carbon ions and hydrogen ions, both of which are positively charged.

In step 56, the RF source 30 is disconnected from the electrode 26 via the switch S1. As a result, the plasma sheath enters an 'afterglow" state where the mix of carbon ions and hydrogen ions are "suspended" within the processing chamber 12.

In the step 58, switches S1 and S2 switch to provide a negative pulse of relatively short duration to the electrode

26. As previously described, the lighter hydrogen ions move faster than the carbon ions. As a result, a disproportionately larger percentage of hydrogen ions are attracted to the electrode 26 during the duration of the short pulse relative to carbon ions. As a result, mostly carbon ions remain in the processing chamber 12 after the negative pulse is complete.

In step 60, switches S1 and S2 switch to provide a positive pulse of relatively long duration to the electrode 26. With the electrode at a positive DC voltage and the substrate pedestal 16 bias to ground, the positively charged carbon ions accelerate towards and bombard the substrate 18. By controlling the amplitude of the positive pulse, along with the bias of the substrate, the carbon ions can have sufficient energy to not only deposit on the surface of the substrate 18, but also implant into the bulk of the substrate 18 as well. As a result, a carbon is formed on the surface of the substrate 18 during the duration of the positive DC voltage pulse.

In decision 62, it is determined if the carbon formed on the substrate 18 is of desired thickness. If yes, then the above-described process is stopped.

In decision 64, it is determined if there is adequate carbon in the processing chamber 12. If adequate carbon is present, then another cycle of steps 56 through 62 is performed. On the other hand, if more carbon is needed, then steps 52-62 are repeated.

With multiple cycles of steps 58 and 60, the voltage applied to the electrode 36 is essentially a series of interleaved negative and positive DC voltage pulses. With each negative pulse, hydrogen ions are removed from the plasma sheath, neutralized, and pumped out of the processing chamber 12. In between the negative pulses, mostly carbon ions bombard the substrate 18 during the positive pulses. By repeating this cycles multiple times, a carbon layer can be formed on the substrate 18 to just about any desired thickness.

Exemplary Embodiment

Figure 3:
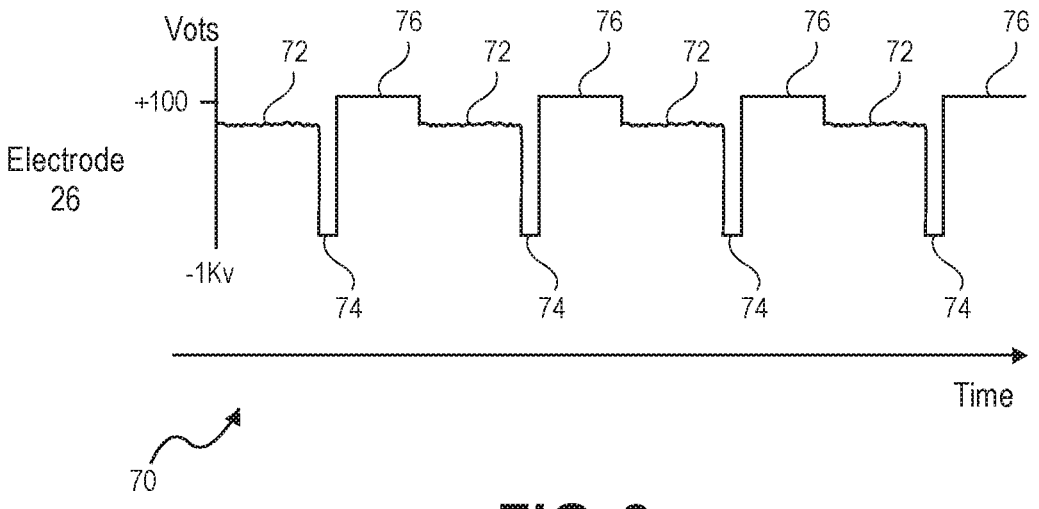
FIG. 3 is a timing diagram showing a Radio Frequency (RF) interspersed with a series of positive and negative DC voltage pulses applied to an electrode in a processing chamber of the processing tool in accordance with a non-exclusive embodiment of the invention.

Referring to FIG. 3, an exemplary timing diagram 70 showing a repeating sequence of Radio Frequency (RF) interspersed with series of negative and positive DC voltage pulses applied to the electrode 26 is shown. In this example, the RF is initially applied for a duration of approximately 50 microseconds, as designated by reference number 72. Thereafter, a negative DC voltage pulse of approximately −1K volt is applied for a short period of time (e.g., 1 to 2 microseconds), as designated by the reference number 74. Next, as designated by reference number 76, a positive DC voltage pulse is applied having amplitude of approximately +100 volts (+/−20%) and a duration of 5 microseconds. By repeating the above sequence, the carbon and hydrogen ions in the plasma sheath are periodically replenished just prior to each cycle to (a) remove mostly the hydrogen ions and (b) bombard the substrate with mostly carbon ions. By repeating this cycle 72, 74 and 76, the resulting carbon layer can be deposited to just about any desired thickness.

It should be understood that the various times and voltage values provided in FIG. 3 diagram are illustrative and should not be construed as limiting in any regard. For instance:

The duration of the time period 72, during which the RF is applied, may widely vary. As the RF is applied, the molecules of the reactant gas(es) in the processing chamber 12 crack and become ionized. The duration of 72 is therefore at least partially predicated on the degree or percentage of ion conversion that is desired. If a smaller percentage of ionization is wanted or desired, then the time period of 72 is relatively short. On the other hand, if it is desired that a high percentage or substantially all the molecules are to be ionized, then the duration of 72 can be longer. The duration of 72 can therefore widely vary, depending on circumstances, from one microsecond or less to more than 1 second.

The duration and amplitude of the negative pulses 74 can also widely vary. During the negative pulses, the main objective is to balance the removal of as many of the low mass ions (e.g., hydrogen) from the plasma sheath, while not removing too many of the higher mass carbon ions. (A primary factor in moving the positive ions from the plasma sheath is the Bohn field, i.e., as the positive ions enter the plasma sheath, they will accelerate by the E-field of the sheath). By adjusting the negative amplitude, the electron temperature Te of electrons of the ions in the plasma sheath can be indirectly controlled. The amplitude of the pulses 74 can therefore widely vary, for example, from −100 volts to −5K volts, to control the rate at which the hydrogen ions are swept out of the plasma sheath to the electrode 26. In addition, the longer the duration of the pulse 74, the more opportunity there is for the larger mass carbon ions to also accelerate sweep out of the plasma sheath and contact the electrode 26. The duration of the negative pulses 74 are therefore preferably selected so that a significant percentage (e.g., 90%-99%) of the hydrogen ions is removed. Once the desired threshold percentage is achieved, then the pulse is terminated. Again, it should be understood that this percentage range is exemplary and can be either higher or lower. The duration of the pulses can therefore widely range from 0.1 microseconds or less to 2 milliseconds or more.

The duration and amplitude of the positive pulse 76 can also widely vary, again depending on circumstances. The amplitude is largely dictated by the amount and depth of sub-implantation that is desired. As a general rule, the high the amplitude, the more energy relative to the substrate the carbon ions will have, and the deeper the sub-implantation will be. With regard to the duration, the limiting factor is often the accumulation of charges on the substrate 18 during bombardment. As the bombardment continues, positive surface charges build up, increasing the potential of the substrate. Eventually the voltage differential between the plasma sheath and the substrate becomes sufficiently small such that the carbon ions no longer have the requisite energy for sub-implantation. When this point, the pulse 76 is preferably terminated. The duration of the pulse can therefore widely vary, from 1 microsecond or less to 30 microseconds or more. The amplitude of the pulse 76 can also widely vary, for example, from +50 volts or less to +500 volts or more.

As previously noted, the controller 24 is responsible for controlling the switches S1 and S2 to bring about the desired duration of the application of the RF in period 72 as well as the duration of the negative pulses 74 and the positive pulses 76. Switch S1 is controlled to couple the electrode 26 to either (a) the RF source 30 or switch S2, whereas switch S2 is used to select either the positive or negative terminal of the variable DC voltage supply 28. Switch S2 thus controls the polarity and the duration of the pulses 74 and. 76, while the variable DC voltage supply defines the amplitude.

The Electrode 26

As previously noted, the electrode 26 may also act to neutralize ions removed from the plasma sheath by surface recombination neutralization. To accomplish this function, the more surface area of the electrode 26 the better.

Figure 4A:
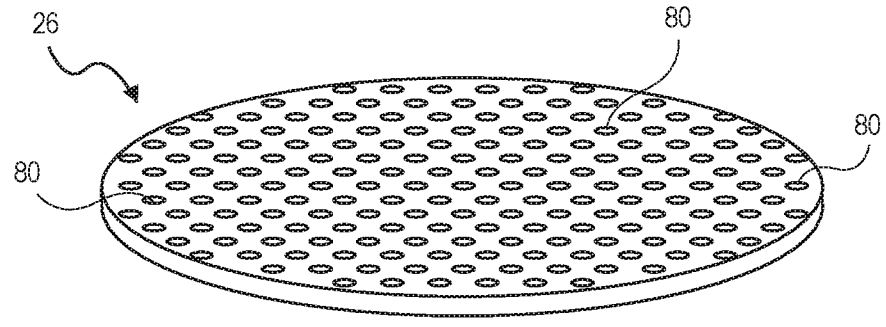
FIG. 4A and FIG. 4B are diagrams of a non-exclusive embodiment of the electrode in the processing chamber of the processing tool.
Figure 4B:
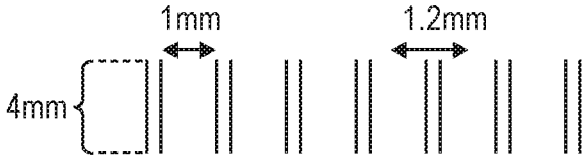

Referring to FIG. 4A and FIG. 4B, diagrams of a non-exclusive embodiment of the electrode 26 is shown. In this particular embodiment, the electrode is circular in shape and spans substantially across the processing chamber 12 in the X and Y directions. The electrode 26 further defines a grid of vertically recesses 80 drilled or otherwise formed though the thickness of the electrode in the Z direction. For example, the individual recesses 80 may range in diameter of 1 to 5 millimeters, have a pitch ranging from 1.2 to 1.5 millimeters and a height of approximately 4 millimeters. With this arrangement, the electrode 26 can potentially have multiple thousands of recesses 80, each of which increases the overall surface area. With more surface area, more ions are likely to contact the electrode 26 and become neutralized. It should be understood that the electrode 26 can be any shape or have any features that may increase the overall surface area. With this in mind, the embodiments illustrated and described herein are merely exemplary and should not be construed as limiting in any regard.

The aspect ratio (height vs. diameters) of the recesses 80 may widely vary. As a general rule, the aspect ratio is preferably selected to provide adequate surface area so that the vast majority of the ions attracted to the electrode 26 are neutralized by surface recombination. If too many ions pass through the recesses 80 without neutralization, then the plasma in effect "wraps" around and forms above the electrode 26, which is undesirable. The aspect ratio of the recesses is therefore preferably "sub-Debye", meaning the aspect ratio is selected to prevent the plasma sheath from wrapping around the electrode 26. In a non-exclusive embodiment, the Applicant has found that an aspect ratio of 4:1 suffices to neutralize the vast majority of ions, preventing the wrapping effect. The ions that are not neutralized are too few to create the wrapping effect and are typically swept away by the pump 34. Again, however, it should be understood that recesses 80 having an aspect ratio of 4:1 and 1 millimeter diameter are one of many examples that can accomplish the sub-Debye neutralization and prevent wrap around. As such, recesses 80 with larger or smaller aspect ratios, diameters and pitches may be used provided they meet the sub-Debye objectives.

However, the higher or thicker the electrode, the more difficult and expensive it is to fabricate. With an aspect ratio of 4:1 for example, the recesses 80 of the electrode 26 are "sub-Debye" because they stop the plasma sheath from wrapping around the electrode 26.

Up to now, the electrode 26 has been characterized as being the electrode for providing RF energy into the processing chamber 12 as well as the negative and positive pulses. It should be understood, however, that this is by no means a requirement. On the contrary, a second electrode can be used for the RF, while the electrode 26 is used for applying the negative and positive DC voltage pulses within the processing chamber 12.

Carbon Layers

The above described process may be used to deposit a wide variety of different types of carbon layers, Such carbon layers may include, but are not limited to, various types of a Diamond Like Carbon (DLC) layer such as hydrogenated amorphous carbon (a-C:H) and hydrogenated tetrahedral amorphous carbon (ta-C:H) and tetrahedral amorphous carbon or "ta-C" and/or other types of carbon layers having predominately sp3 bonds such as diamond layers, carbon layers having relatively large crystal structures (1 to many micrometers) or relatively small crystal structures (sub nanometer size), carbon layers including predominately sp2 bonds such as graphite, and so called amorphous carbon which is generally characterized as being "dust like" and having little to no SP3 and/or SP2 bonds. With dust-like properties and minimal sp3 bonding at the nanometer level, amorphous carbon layers impart significantly less surface stresses on the underlying substrate, significantly preventing substrate bending, bowing and/or cracking.

A "hard mask" is often used in the semiconductor industry as a patterning mask instead of other "soft" organic materials, such as polymer resist. With common etchant gases used for wafer patterning, such as fluorine, chlorine, etc., "soft" polymer masks are susceptible to degradation. As a result, the patterned features on the semiconductor wafer are often less precise. Various carbon layers, on the other hand, are significantly more stable, with a very low, predictable, etch rate, which makes such layers highly suitable for use as hard masks in the semiconductor fabrication industry. Carbon hard masks exhibit significantly less degradation when exposed to fluorine and/or chlorine etching chemistries compared to a polymer resin, resulting more precise etches, finer geometries, and fewer processing defects.

Figure 5:
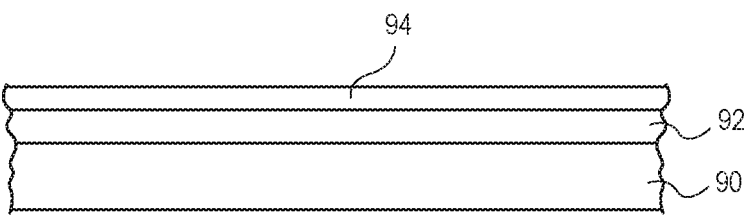
FIG. 5 is a diagram illustrating a substrate with a carbon layer formed thereon in accordance with non-exclusive embodiment of the invention.

Referring to FIG. 5, a cross-section of exemplary semiconductor substrate 90 is illustrated. The substrate 90 includes one (or more layers) 92, such as but not limited to, an insulating layer, a polysilicon layer, a metalization layer, silicon oxide layer, etc. (for the sake of simplicity, only one layer 92 is shown). The semiconductor 90 also includes a carbon layer 94 formed on top of the one or more layers 92. The carbon layer 94 is formed, in non-exclusive embodiments, using the tool 10 as described herein. In various alternative embodiments, the carbon layer 94 is any of the above-listed types of carbon layers. In yet additional embodiments, the carbon layer 94 is a patterning mask for patterning or and/or doping the underlying layer or layers 92.

Large Scale Semiconductor Wafer Fabrication

The ability to form a carbon layer 94 in conventional PECVD tool enables using any of the above-listed types of carbon layers as a hard mask, or for other types of layers, in the large scale industrial production of semiconductor wafers.

Figure 6:
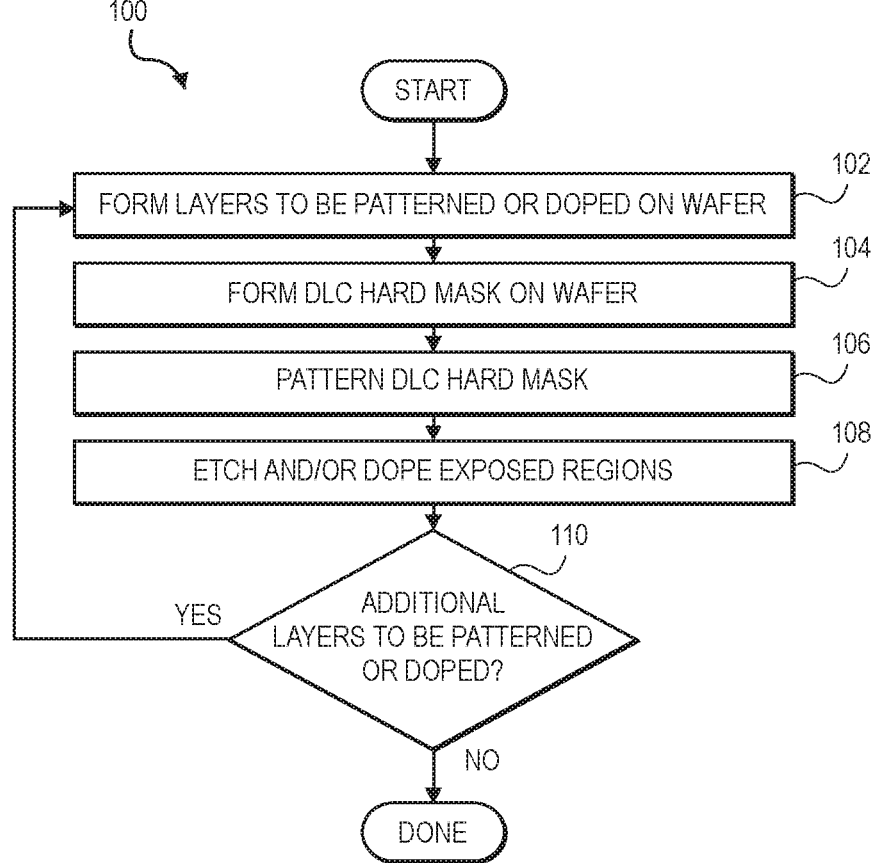
FIG. 6 is a diagram illustrating a flow chart for fabricating a semiconductor wafer using a carbon mask in accordance with the present invention.

Referring to FIG. 6, a flow diagram 100 for using carbon layer 94 as a patterning mask during large scale industrial fabrication of semiconductor wafers is illustrated.

In an initial step 102, any layers 92 that are to be patterned and/or doped on a semiconductor wafer 90 are formed. Such layers may include, but are not limited to, silicon layers, polysilicon layers, metal layers such as aluminum, copper, tungsten, etc., insulating layers, oxide layers, etc.

In step 104, an amorphous carbon layer 94 is formed on the semiconductor wafer as described herein. The amorphous carbon layer 94 may be any of the above-recited types of carbon.

In step 106, the carbon layer 94 is patterned to expose certain regions while covering other regions.

In step 108, the exposed regions on the semiconductor wafer are either etched, doped, or both. The regions of the semiconductor wafer 90 that remained covered by the carbon layer 94 remain protected and are not etched and/or doped.

In decision 110, it is determined if additional layers on the semiconductor wafer 90 are to be etched and/or doped. If yes, then the operations 102-108 are repeated. If not, the wafer will typically undergo other processing steps until fabrication is complete, as is well known in the semiconductor arts.

Again, since the one or more carbon layer(s) 94 can be formed and/or patterned in a tool 10 as described herein, the above process can be implemented on a large industrial scale.

Types of PECVD Tools

Various types of PECVD tools are known. Such PECVD tools include, but are not limited to, Low Pressure (LPCVD), Ultra High Vacuum (UHVCVD), Atomic Layer Deposition (ALD), a Plasma-Enhanced Atomic Layer Deposition (PEALD), etc. In addition, the above-listed PECVD tools may also have a single processing chamber capable of processing one or more substrates or multiple processing chambers, each capable of processing one or more substrates. Regardless of the type of PECVD tool, or the number of chambers, each can be used to form carbon layers as described herein on one or more substrates.

Alternative Embodiments

The present invention has thus far been described in the context of (1) creating a mix of carbon and hydrogen ions, (2) removing significant percentage of the hydrogen ions from the mix, and (3) depositing the remaining mostly carbon ions onto a surface of a substrate. It should be understood, however, that the present invention should by no means be limited to hydrogen and carbon. On the contrary, the present invention can be used with any species that (1) can be separated by atomic mass and (2) the remaining species is to be deposited onto a workpiece.

Figure 7:
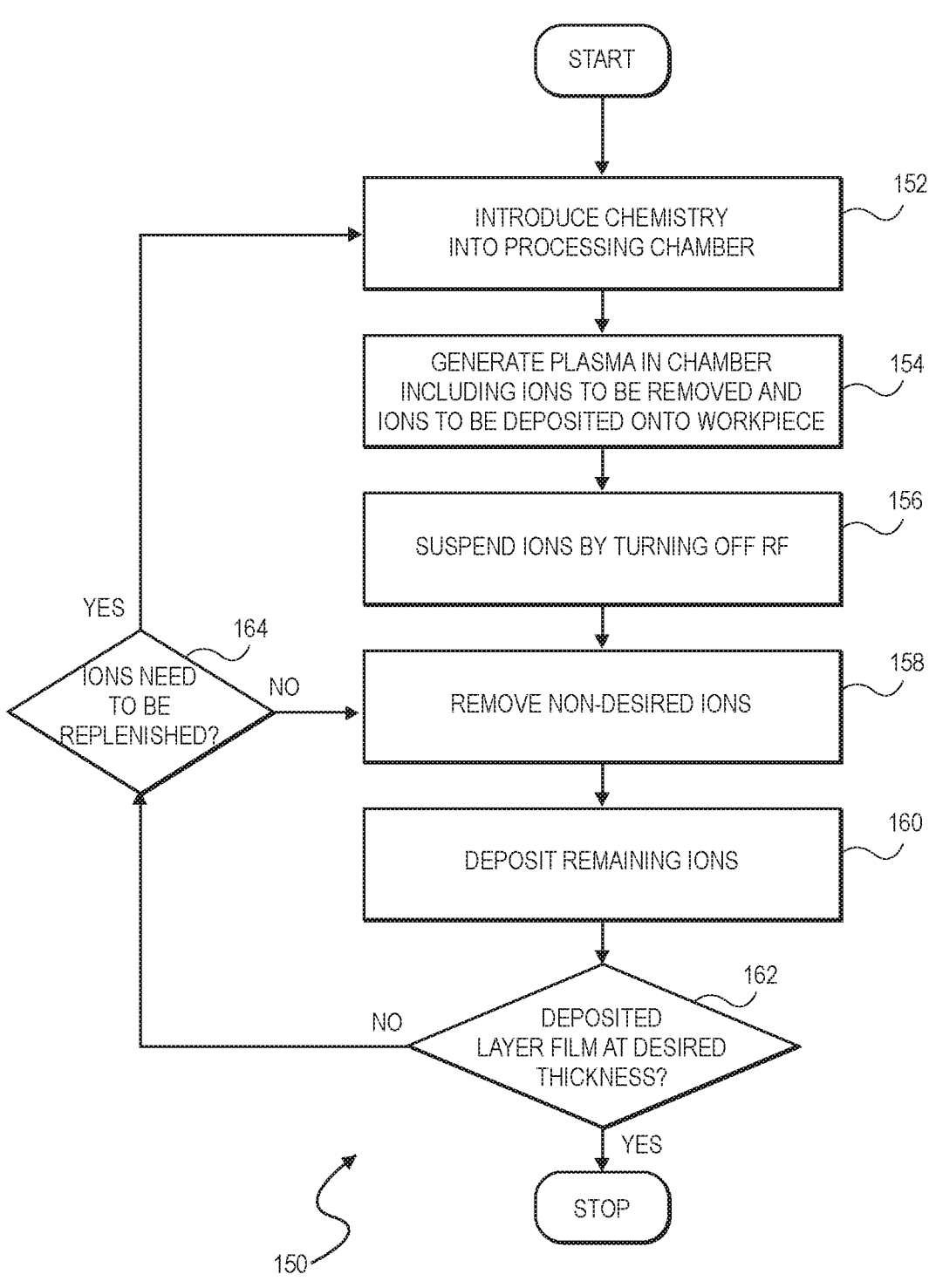
FIG. 7 is an operational flow diagram of the processing tool showing a sequence of steps for forming a layer on a substrate in accordance with non-exclusive embodiments of the invention In the drawings, like reference numerals are sometimes used to designate like structural elements. It should also be appreciated that the depictions in the figures are diagrammatic and not necessarily to scale.

FIG. 7 is an operational flow diagram 150 of the processing tool showing a sequence of steps for forming a layer of other species on a substrate in accordance with non-exclusive embodiments of the invention.

In step 152, a chemistry is introduced into the processing chamber 12. The chemistry includes both one or more species that needs to be removed by mass separation and one or more species that are to be deposited onto a substrate.

In step 154, plasma is generated in the chamber 12 by applying RF from source 30 to the electrode 26. The plasma contains a mix of ions of the one or more species included in the chemistry respectively.

In step 156, the RF source is removed from the electrode 26. As a result, the mix of ions including those that are to be removed and those that are to be deposited on the workpiece are suspended within the chamber.

In step 158, the ions that are to be removed are removed from the mix by applying the varying DC voltage to the electrode 26. During pulses of a first polarity, the ions are removed from the mix, either by being attracted to or repelled away from the electrode 26, depending on the charge of the ions, the first polarity and the location of the electrode 26.

In step 160, the remaining ions in the mix are deposited onto the workpiece. During this step, the variable DC supply may or may not provide second pulses of a second polarity. In cases when pulses or a second polarity are not used, just the one polarity is turned on and off.

In step 162, it is determined if the deposited layer on the workpiece is of sufficient thickness. If yes, then the process is complete. If not, then it is determined if the ions in the mix need to be replenished in step 164. If not, then steps 158 and 160 are repeated. If yes, then steps 152-162 are repeated.

In another non-exclusive embodiment, the above described process can be used to deposit a layer of silicon nitride onto a workpiece. Using the above process, a chemistry of hydrogen, silicon and nitride is introduced into the chamber (e.g., nitrogen and SiH4), the RF is applied, creating a mix of hydrogen, silicon and nitrogen ions. When the varying DC voltage is applied, the hydrogen ions are mostly removed from the mix during pulses of one polarity. As a result, silicon and nitrogen ions are deposited onto the workpiece between the pulses of the one polarity, regardless if second pulses of a second polarity are used or not. Either way, a silicon nitride layer is formed.

It should be understood that the embodiments provided herein are merely exemplary and should not be construed as limiting in any regard. Although only a few embodiments have been described in detail, it should be appreciated that the present application may be implemented in many other forms without departing from the spirit or scope of the disclosure provided herein. Therefore, the present embodiments should be considered illustrative and not restrictive and is not to be limited to the details given herein, but may be modified within the scope and equivalents of the appended claims.

What is claimed is:

1. A method of forming a carbon layer on a substrate in a processing chamber, the method comprising:
   (i) introducing a precursor into the processing chamber, the precursor including carbon and a non-carbon element;
   (ii) generating a plasma in the processing chamber using an RF source, the plasma including carbon ions and non-carbon ions with lighter mass than the carbon ions;
   (iii) suspending the carbon ions and the non-carbon ions in the processing chamber by removing the RF source; and after performing (i), (ii) and (iii),
   (a) at least partially removing the non-carbon ions from the carbon ions in the processing chamber;
   (b) bombarding the substrate with mostly the carbon ions in the processing chamber after (a); and
   (c) forming the carbon layer from the carbon ions bombarding the substrate.

2. The method of claim 1, wherein the substrate is a semiconductor wafer and the carbon layer is used as a patterning mask.

3. The method of claim 1, further comprising repeating (a) and (b) until the carbon layer is of a desired thickness on the substrate.

4. The method of claim 1, further comprising periodically repeating (i) and (ii) to replenish the carbon ions in the processing chamber as needed.

5. The method of claim 1, wherein a ratio of the carbon ions to the non-carbon ions bombarding the substrate is higher than if the non-carbon ions were not at least partially removed from the processing chamber.

6. The method of claim 1, wherein the at least partially removing non-carbon ions from carbon ions comprises at least partially separating the non-carbon ions from the carbon ions in the processing chamber by applying a time-varying DC voltage to an electrode.

7. The method of claim 6, wherein applying the time-varying DC voltage to the electrode comprises neutralizing charges of non-carbon ions that contact a surface element of the electrode, the surface element comprising a catalytic material.

8. The method of claim 6, wherein the time-varying DC voltage comprises a series of pulses including negative DC voltage pulses and positive DC voltage pulses.

9. The method of claim 8, wherein more of the non-carbon ions are removed from the processing chamber compared to the carbon ions during the negative DC voltage pulses, and wherein each of the negative DC voltage pulses comprises a duration of 0.1 to 2 microseconds.

10. The method of claim 8, wherein bombarding the substrate with mostly the carbon ions comprises bombarding the substrate with mostly the carbon ions during the positive DC voltage pulses, the positive DC voltage pulses causing the carbon ions to move in the direction of the substrate.

11. The method of claim 10, wherein each of the positive DC voltage pulses comprises a duration of 1 to 30 microseconds.

12. A method of forming a carbon layer on a substrate in a processing chamber, the method comprising:
   (i) introducing a precursor into the processing chamber, the precursor including carbon and a non-carbon element;
   (ii) generating a plasma in the processing chamber using an RF source, the plasma including carbon ions and non-carbon ions with lighter mass than the carbon ions;
   (iii) suspending the carbon ions and the non-carbon ions in the processing chamber;
   (a) at least partially removing the non-carbon ions from the carbon ions in the processing chamber by
      applying a negative DC voltage pulse to an electrode located distal to the substrate within the processing chamber, the negative DC voltage pulse causing more of the non-carbon ions to be attracted to the electrode relative to the carbon ions,
      neutralizing a charge of the non-carbon ions by surface recombination neutralization when the attracted non-carbon ions contact a surface of the electrode, and
      applying a vacuum in the vicinity of the electrode to remove the neutralized non-carbon ions from the processing chamber;
   (b) bombarding the substrate with mostly the carbon ions in the processing chamber after (a); and
   (c) forming the carbon layer from the carbon ions bombarding the substrate.

13. The method of claim 12, wherein the substrate is a semiconductor wafer and the carbon layer is used as a patterning mask.

14. The method of claim 12, further comprising repeating (a) and (b) until the carbon layer is of a desired thickness on the substrate.

15. The method of claim 12, further comprising periodically repeating (i) and (ii) to replenish the carbon ions in the processing chamber.

16. The method of claim 12, wherein the surface of the electrode comprises a catalytic material.

17. The method of claim 12, wherein the negative DC voltage pulse comprises a duration of 0.1 to 2 microseconds.

18. The method of claim 12, wherein bombarding the substrate with mostly the carbon ions comprises applying a positive DC voltage pulse to the electrode causing the carbon ions to move in the direction of the substrate.

19. The method of claim 18, wherein the positive DC voltage pulse comprises a duration of 1 to 30 microseconds.

* * * * *